(12) United States Patent
Ogiwara et al.

(10) Patent No.: US 7,759,928 B2
(45) Date of Patent: Jul. 20, 2010

(54) SEMICONDUCTOR DEVICE INCLUDING AN INTERNAL VOLTAGE GENERATION CIRCUIT AND A FIRST TEST CIRCUIT

(75) Inventors: Ryu Ogiwara, Kanagawa-ken (JP); Daisaburo Takashima, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 174 days.

(21) Appl. No.: 11/937,056

(22) Filed: Nov. 8, 2007

(65) Prior Publication Data

US 2008/0111575 A1 May 15, 2008

(30) Foreign Application Priority Data

Nov. 9, 2006 (JP) .............................. 2006-304445

(51) Int. Cl.
*G01R 31/02* (2006.01)
(52) U.S. Cl. ..................................... 324/158.1; 324/763
(58) Field of Classification Search ........................ None
See application file for complete search history.

(56) References Cited

U.S. PATENT DOCUMENTS 5,523,977 A * 6/1996 Tobita et al. ................. 365/201
5,856,756 A * 1/1999 Sasahara et al. .............. 327/540
6,373,266 B1 * 4/2002 Carelli et al. ................ 324/716
6,879,174 B2 * 4/2005 Uchida ........................ 324/765
6,958,947 B2 * 10/2005 Park et al. .................... 365/228

FOREIGN PATENT DOCUMENTS

JP      2002-298599      10/2002

\* cited by examiner

*Primary Examiner*—Paresh Patel
(74) *Attorney, Agent, or Firm*—Turocy & Watson, LLP

(57) ABSTRACT

According to an aspect of the invention, there is provided, a semiconductor device, including an internal voltage generation circuit generating a prescribed voltage, a first test circuit connecting to a voltage-supplying wiring, one end of the voltage-supplying wiring being connected to a source wiring and the other end of the voltage-supplying wiring being connected to the internal voltage generation circuit, the first test circuit being supplied an outer voltage from the source wiring and a voltage of the internal voltage generation circuit through the voltage-supplying wiring, the first test circuit generating a prescribed resistance value on a basis of a control input from an outer portion in a test mode.

6 Claims, 5 Drawing Sheets

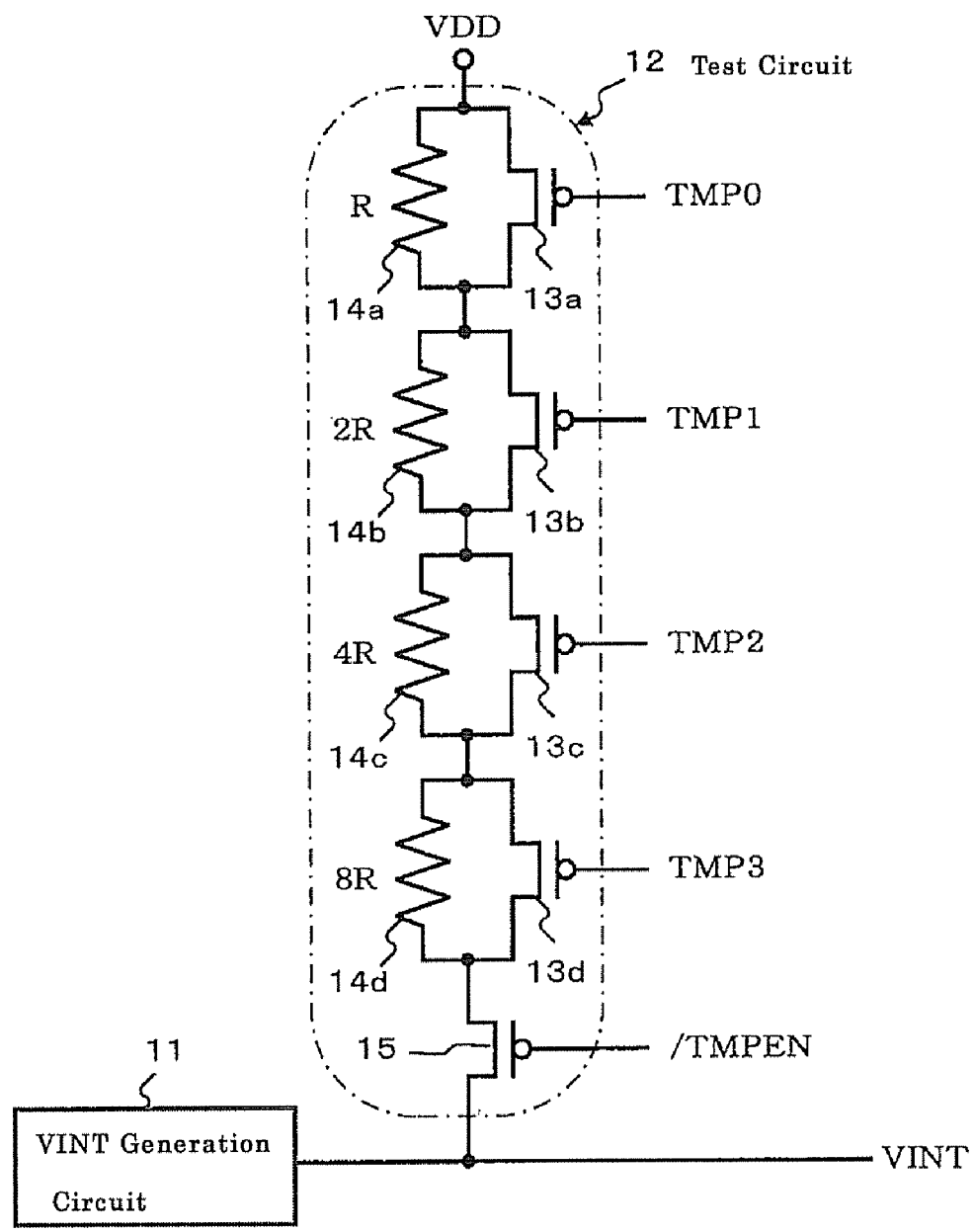
F I G. 1

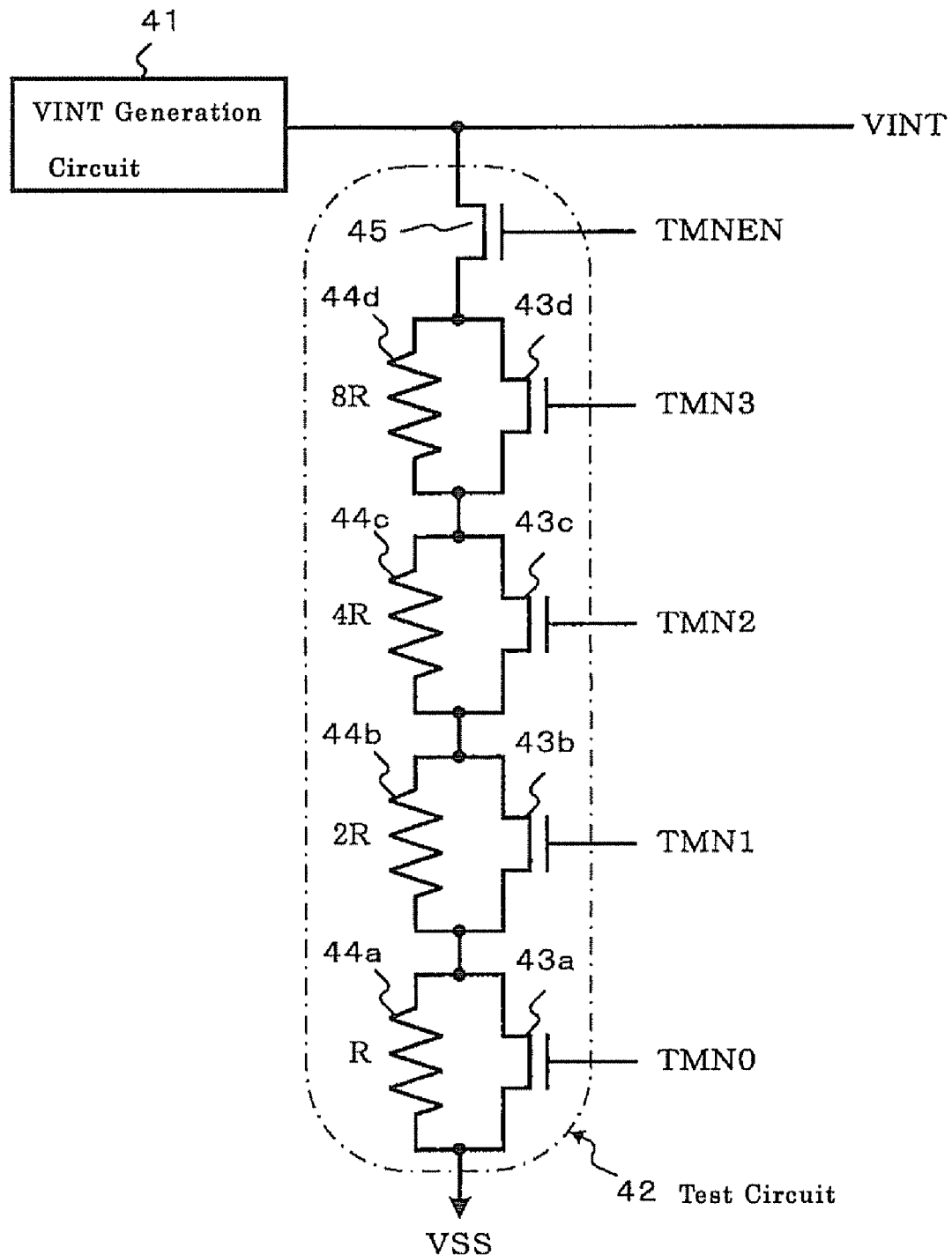
F I G. 4

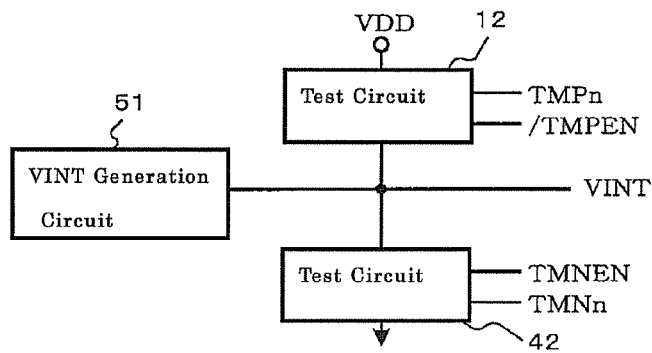
F I G. 5
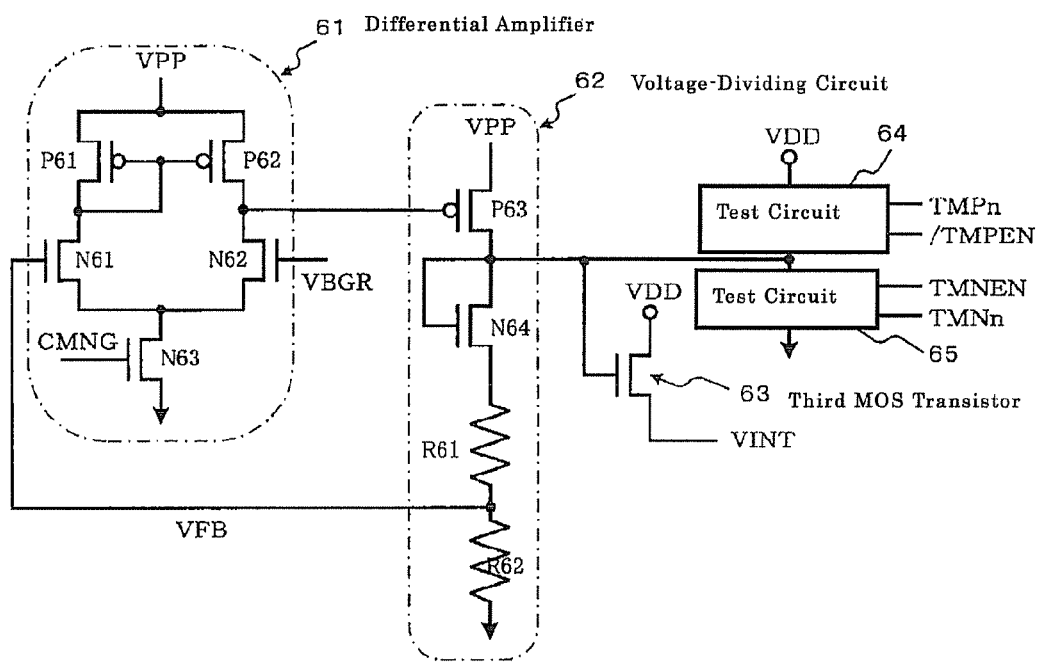
F I G. 6

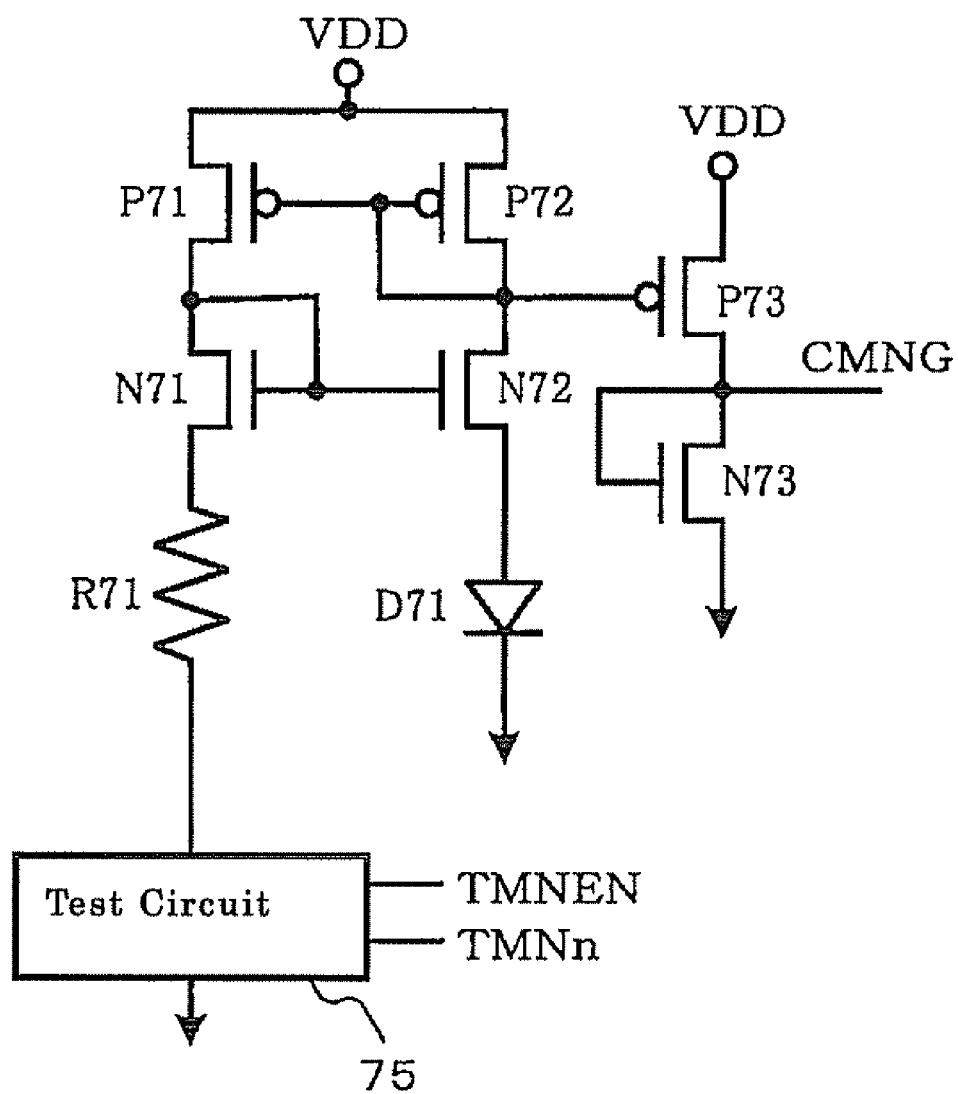
F I G. 7

US 7,759,928 B2

SEMICONDUCTOR DEVICE INCLUDING AN INTERNAL VOLTAGE GENERATION CIRCUIT AND A FIRST TEST CIRCUIT

CROSS REFERENCE TO RELATED APPLICATION

This application is based upon and claims the benefit of priority from the prior Japanese Application (No. 2006-304445, filed Nov. 9, 2006), the entire contents of which are incorporated herein by reference.

FIELD OF THE INVENTION

The present invention relates to a semiconductor device, and more particularly, a semiconductor device including an internal voltage generation circuit.

DESCRIPTION OF THE BACKGROUND

Recently, lowering an electrical voltage applied to a gate oxide or a p-n junction in a MOS transistor has been required for retaining a reliability of the MOS transistor accompanying with progress of miniaturization in a fabricating process of a semiconductor device. However, lowering a source voltage of a system used by users can not be easily performed in considering compatibility with conventional products. Therefore, a method to generate a prescribed source voltage corresponding to a fabricating process by setting an internal voltage generation circuit in a semiconductor device is disclosed in Japanese Patent Publication (Kokai) No. 2002-298599, for example. Especially, the semiconductor devices included a DRAM (Dynamic Random Access Memory) cell or an EEPROM (Electrical Erasable PROM) cell has been required a plurality of the source voltage having complex voltage characteristics to retain characteristics of the circuit operation and reliability of the memory cell.

However, a conventional semiconductor device present a problem to be not able to measure a change of the internal voltage, when a load current is added to an output of the internal voltage generation circuit by an operation of the internal circuit. Such the load current has two kinds of currents. One is a current with raising the internal voltage by flowing from the source voltage and the other is a current with lowering the internal voltage by flowing out to the ground. An amount of the internal voltage by the current-flowing is dependent on architecture and drivability of the circuit. Therefore, when the drivability of the circuit is changed by the fabricating process or the like, the internal circuit presents a problem to be able to confirm on a margin of the circuit operation in the internal circuit being used by only an indirect method such as a simulation. Furthermore, the internal circuit presents another problem to be not able to confirm on a margin of the circuit operation produced by change of the fabricating process in the internal voltage generation circuit by a direct method.

SUMMARY OF THE INVENTION

According to an aspect of the invention, there is provided, a semiconductor device, including an internal voltage generation circuit generating a prescribed voltage, a first test circuit connecting to a voltage-supplying wiring, one end of the voltage-supplying wiring being connected to a source wiring and the other end of the voltage-supplying wiring being connected to the internal voltage generation circuit, the first test circuit being supplied an outer voltage from the source wiring and a voltage of the internal voltage generation circuit through the voltage-supplying wiring, the first test circuit generating a prescribed resistance value on a basis of a control input from an outer portion in a test mode.

Further, another aspect of the invention, there is provided, a semiconductor device, comprising an internal source generation circuit including a differential amplifier, a first MOS transistor, a second MOS transistor, a first resistance element, a second resistance element and a third MOS transistor, a first input of the differential amplifier being connected to a reference voltage, a source terminal of the first MOS transistor being connected to a first voltage source, a gate terminal of the first MOS transistor being connected to an output of the differential amplifier, a drain terminal of the second MOS transistor being connected to a drain terminal of the first MOS transistor, the drain terminal of the second MOS transistor being connected to a drain terminal and a gate terminal of the second MOS transistor as a diode, the first resistance element and the second resistance element being connected between a source terminal of the second MOS transistor and a second voltage source in series, a connection node being connected to a second input of differential amplifier, a drain terminal of the third MOS transistor being connected to a third voltage source, a gate terminal of the third MOS transistor being connected to a drain terminal of the second MOS transistor, and a source terminal of the third MOS transistor supplying a voltage and a current to an internal voltage source, a first test circuit, one end of the first test circuit being connected to a source wiring and the other end of the first test circuit being connected to a gate terminal of the third MOS transistor, the drain terminal of the second MOS transistor and the drain terminal of the first MOS transistor, the first test circuit supplying a current on a basis a control input to the first resistance element or the second resistance element in a test mode.

Further, another aspect of the invention, there is provided, a semiconductor device, including an internal voltage generation circuit generating a prescribed voltage, a bias circuit being connected to the internal voltage generation circuit, the bias circuit controlling a current of the internal voltage generation circuit, and a first test circuit, one end of the first test circuit being connected to a source wiring and the other end of the first test circuit being connected to the bias circuit, the first test circuit supplying a current on a basis of a control input to an internal node of the bias circuit in a test mode.

BRIEF DESCRIPTION OF THE DRAWINGS

FIG. 1 is a circuit diagram showing a semiconductor device according to a first embodiment of the present invention;

FIG. 4 is a circuit diagram showing a semiconductor device according to a second embodiment of the present invention;

FIG. 5 is a circuit diagram showing another semiconductor device according to the second embodiment of the present invention;

FIG. 6 is a circuit diagram showing a VINT generation circuit in a semiconductor device according to a third embodiment of the present invention;

FIG. 7 is a circuit diagram showing a bias circuit of a VINT generation circuit in a semiconductor device according to a fourth embodiment of the present invention.

DETAILED DESCRIPTION OF THE INVENTION

Figure 2:
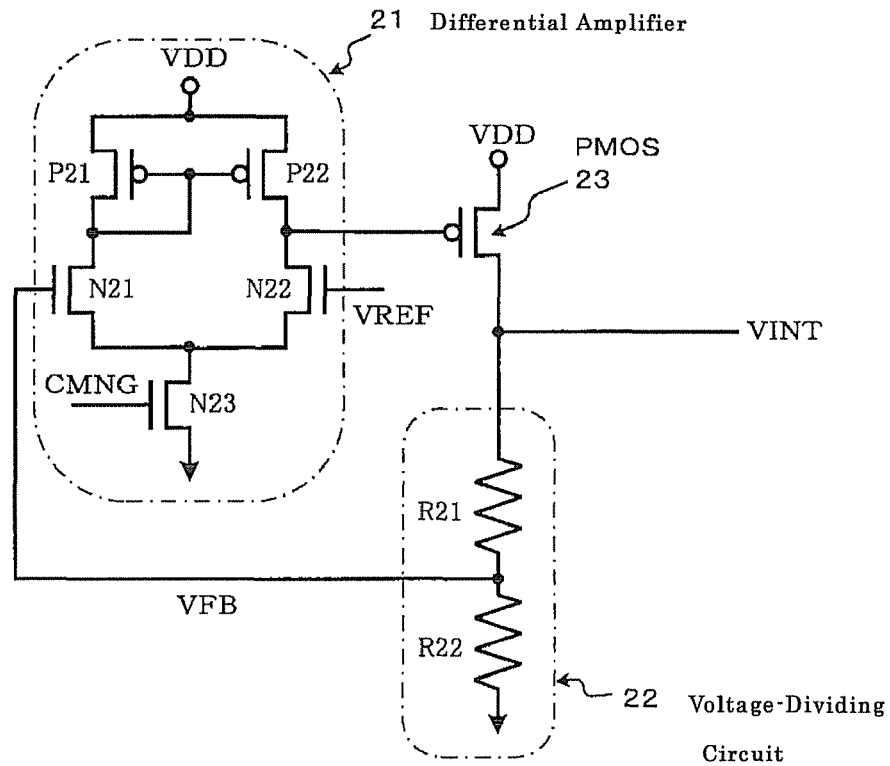
FIG. 2 is a circuit diagram showing a VINT generation circuit in the semiconductor device according to the first embodiment of the present invention.

Embodiments of the present invention will be described below in detail with reference to the drawings mentioned above.

First Embodiment

FIG. 1 is a circuit diagram showing a semiconductor device in a first embodiment of the present invention. Here, a portion mainly relating to a test of an operation margin in an internal voltage generation circuit is illustrated.

The semiconductor device in the first embodiment of the present invention includes an internal voltage generation circuit 11 generating a prescribed internal voltage (Hereafter, the internal voltage generation circuit is called a VINT generation circuit 11), and a test circuit 12 for testing an operation margin of the VINT generation circuit 11.

An output of the VINT generation circuit 11 is connected to a voltage-supplying wiring (Hereafter, the voltage-supplying wiring is called a wiring VINT) for supplying a prescribed internal voltage to an internal circuit (not illustrated). One end of the test circuit 12 is connected to a source wiring with a source voltage (Hereafter, the source voltage is called a voltage VDD) for supplying a source voltage applied from an outer portion and the other end of the test circuit 12 is connected to the wiring VINT.

First control signals of 4 bits (Hereafter, the first control signals are called a signal TMP0, a signal TMP1, a signal TMP2 and a signal TMP3) are input into the first control inputs of the test circuit 12 for controlling a resistance value of the test circuit 12. A second control signal (Hereafter, the second control signal is called a signal /TMPEN) is input into a second control input being showed as a test mode. A sign "/" shows that the signal is complementary.

The VINT generation circuit 11 is operated to supply a prescribed voltage to the wiring VINT in spite of an operation current change within a certain amount of range accompanying with a circuit operation in the internal circuit.

As shown in FIG. 1, the test circuit 12 includes p-type MOS transistors (Hereafter, the transistors are called a PMOS 13a, a PMOS 13b, a PMOS 13c and a PMOS 13d), four resistor units constituted of resistance elements (Hereafter, the resistance elements are called a resistor 14a, a resistor 14b, a resistor 14c and a resistor 14d) and a switching element 15.

Namely, a source terminal and a drain terminal of the PMOS 13a are connected to both ends of the resistor 14a in parallel. A source terminal of the PMOS 13a as one end of the test circuit 12 is connected to the voltage VDD and a gate terminal of the PMOS 13a is connected to the signal TMP0.

A source terminal and a drain terminal of the PMOS 13b is connected to both ends of the resistor 14b in parallel. A source terminal of the PMOS 13b is connected to a drain terminal of the PMOS 13a. A gate terminal of the PMOS 13b is connected to the signal TMP1.

A source terminal and a drain terminal of the PMOS 13c are connected to both ends of the resistor 14c in parallel. A source terminal of the PMOS 13c is connected to a drain terminal of the PMOS 13b. A gate terminal of the PMOS 13c is connected to the signal TMP2.

A source terminal and a drain terminal of the PMOS 13d are connected to both ends of the resistor 14d in parallel. A source terminal of the PMOS 13d is connected to a drain terminal of the PMOS 13c. A gate terminal of the PMOS 13d is connected to the signal TMP3.

A switching element 15 is a p-type MOS transistor (Hereafter, the p-type MOS transistor is called a PMOS 15). A source terminal of the PMOS 15 is connected to a drain terminal of the PMOS 13d. A gate terminal of the PMOS 15 is input the signal /TMPEN. A drain terminal of the PMOS 15 as the other end of the test circuit 12 is connected to the wiring VINT.

As shown in FIG. 1, each of resistance values of the resistors 14a, 14b, 14c and 14d is set up to be a different value with an ordinal-number power of two, respectively. Namely, the resistor 14a, the resistor 14b, the resistor 14c and the resistor 14d are set up at R, 2R, 4R and 8R, respectively.

The PMOS 13a, the PMOS 13b, the PMOS 13c and the PMOS 13d are switched on when each of the gate inputs is "L" and are switched off when each of the gate inputs is "H", respectively.

Accordingly, a synthetic resistance value of the test circuit 12 can be selected from fifteen kinds of resistances from R to 15R corresponding to all different combinations in the signal TMP0, the signal TMP1, the signal TMP2 and signal TMP3, respectively. On the other hand, the case of the signal TMP0, the signal TMP1, the signal TMP2 and the signal TMP3 being all "L" is not used as the synthetic resistance value being zero.

In a case of a test-mode, the signal /TMPEN is "L". In a case of an operation-mode except the test-mode, the signal /TMPEN is "H".

FIG. 2 is a circuit diagram showing a VINT generation circuit of the semiconductor device in the first embodiment of the present invention. Here is illustrated one circuit type, for example. In the circuit, a reference voltage (Hereafter, the reference voltage is called a voltage VREF) and a feedback voltage (Hereafter, the feedback voltage is called a voltage VFB) obtained from an output are compared and a gate of the p-type MOS transistor 23 (Hereafter, the p-type MOS transistor 23 is called a PMOS 23) is controlled.

As shown in FIG. 2, the VINT generation circuit 11 includes a differential amplifier 21, a voltage-dividing circuit 22 and the PMOS 23. The differential amplifier 21 compares between the voltage VREF and the voltage VFB. The voltage-dividing circuit 22 generates the voltage VFB by dividing the VINT voltage as an output.

A first input of the differential amplifier 21 is connected to the voltage VREF and a second input of the differential amplifier 21 is connected to the voltage VFB being an output of the voltage-dividing circuit 22. An output of the differential amplifier 21 is connected to a gate terminal of the PMOS 23.

A source terminal is connected to the voltage VDD and a drain terminal of the PMOS is connected to the wiring VINT and an input of the voltage-dividing circuit 22 as an output of the VINT generation circuit 11.

The differential amplifier 21 includes two p-type MOS transistors (Hereafter, the p-type MOS transistors are called a PMOS P21 and a PMOS P22) and three n-type MOS transistors (Hereafter, the n-type MOS transistors are called a NMOS N21, a NMOS N22 and a NMOS N23).

A source terminal of the PMOS P21 is connected to the voltage VDD. A gate terminal and a drain terminal of the PMOS P21 are connected to a gate terminal of the PMOS P22. A source terminal of the PMOS P22 is connected to the voltage VDD and a drain terminal is connected to a gate terminal of the PMOS 23 as an output of the differential amplifier 21.

A drain terminal of the NMOS N21 is connected to a drain terminal of the PMOS P21 and a gate terminal of the NMOS N21 is connected to the voltage VFB. A drain terminal of the NMOS N22 is connected to a drain terminal of the PMOS P22 and a gate terminal of the NMOS N22 is connected to the voltage VREF.

A source terminal of the NMOS N21 and a source terminal of the NMOS N22 are connected to a drain terminal of the NMOS N23. A source terminal of the NMOS N23 is connected to an earth voltage (Hereafter, the earth voltage is called a voltage VSS) and a bias voltage (Hereafter, the bias voltage is called a voltage CMNG) is input into a gate terminal of the NMOS N23.

The voltage-dividing circuit 22 is constituted of two resistance element R21 and R22 in series and divides an output of the VINT generation circuit 11 by using resistors so as to generate the prescribed feedback voltage VFB.

Figure 3:
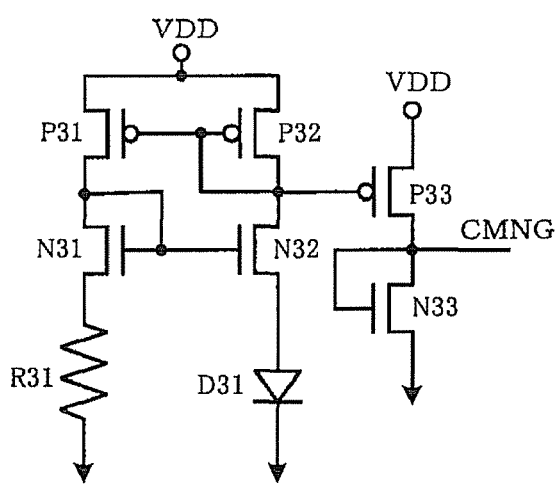
FIG. 3 is a circuit diagram showing a bias circuit in the VINT generation circuit in the semiconductor device according to the first embodiment of the present invention.

FIG. 3 is a circuit diagram showing a bias circuit of the VINT generation circuit in the semiconductor device in the first embodiment of the present invention. The bias circuit controls current flowing in the differential amplifier 21 as a suitable value for improvement of response with respect to the VINT generation circuit 11 and a phase margin of feedback loop. As shown in FIG. 3, the bias circuit is constituted of three p-type MOS transistors (Hereafter, the MOS transistors are called a PMOS P31, a PMOS P32 and a PMOS P33), three n-type MOS transistors (Hereafter, the MOS transistors are called a NMOS P31, a NMOS P32 and a NMOS P33), a resistance element R31 and a diode D31.

A source terminal of the PMOS P31, a source terminal of the PMOS P32 and a source terminal of the PMOS P33 are connected to the voltage VDD. A gate terminal of the PMOS P31 is connected to a gate terminal and a drain terminal of the PMOS P32. A gate terminal of the PMOS P33 is connected to a drain terminal of the PMOS P32. A drain terminal of the PMOS P33 is supplied to the differential amplifier 21 as an output voltage CMNG in the bias circuit.

A drain terminal and a gate terminal of the NMOS N31 are connected to a drain terminal of the PMOS P31. A drain terminal of the NMOS N32 is connected to a drain terminal of the PMOS P32. A gate terminal of the NMOS N32 is connected to a gate terminal of the NMOS N31. A drain terminal and a gate terminal of the NMOS N33 are connected to a drain terminal of the PMOS P33. A source terminal of the NMOS N33 is connected to the voltage VSS.

The resistance element R31 is connected between a source terminal of the NMOS N31 and the voltage VSS and the diode D31 is connected between a source terminal of the NMOS N32 and the voltage VSS by forward bias.

Next, one test method, for example, on the VINT generation circuit 11 in the semiconductor device having the structure mentioned above is explained.

After the signal TMP 0, the signal TMP 1, the signal IMP 2 and the signal TMP 3 are assigned to generate a synthetic resistance value corresponding to a prescribed test current, a test mode is entered. The signal /TMPEN being put into the "L" causes to a current to flow from the voltage VDD into the wiring VINT, so that a voltage level of the wiring VINT rises up corresponding to drivability of the VINT generation circuit 11.

Measuring the rising level of the voltage leads to confirm an operation margin of the VINT generation circuit 11 corresponding to a change of a load current accompanying with an operation of the internal circuit. Therefore, the minimum resistance value R of the test circuit 12 is set up to flow a current which is larger than the maximum load current flowed instantaneously into the wiring VINT in the conventional operation.

According to the first embodiment, as a load current flowing from the test circuit 12 into the VINT generation circuit 11 is generated in simulation, the operation margin of the VINT generation circuit 11 can easily confirm including process deviation in a fabricating process.

Furthermore, according to the first embodiment, fifteen kinds of resistance values combined with the signal TMP0, the signal TMP1, the signal TMP2 and the signal TMP3 can be selected. Therefore, the operation margin of the VINT generation circuit 11 can be effectively tested after the fabricating process. As a result, a circuit operation reliability of the VINT generation circuit 11 can be improved.

Second Embodiment

FIG. 4 is a circuit diagram showing a semiconductor device in a second embodiment of the present invention. Here, a portion mainly relating to a test of an operation margin in an internal voltage generation circuit (a VINT generation circuit 41) is illustrated.

The semiconductor device in the second embodiment of the present invention includes the VINT generation circuit 41 generating a prescribed internal voltage and a test circuit 42 for testing an operation margin of the VINT generation circuit 41.

An output of the VINT generation circuit 41 is connected to a voltage-supplying wiring (VINT) for supplying a prescribed internal voltage to an internal circuit (not illustrated). One end of the test circuit 42 is connected to another source wiring with an earth voltage (VSS) for supplying an earth voltage applied from an outer portion and the other end of the test circuit 42 is connected to the wiring VINT.

First control signals of 4 bits (Hereafter, the first control signals are called a signal TMN0, a signal TMN1, a signal TMN2 and a signal TMN3) are input into the first control inputs of the test circuit 42 for controlling a resistance value of the test circuit 42. A second control signal (Hereafter, the second control signal is called a signal /TMNEN) is input into a second control input being showed as a test mode.

As a constitution, a function and an operation of the VINT generation circuit 41 are the same as those of the VINT generation circuit 11, explanation in detail on the VINT generation circuit 41 is omitted.

As shown in FIG. 4, the test circuit 42 includes n-type MOS transistors (Hereafter, the transistors are called a NMOS 43$a$, a NMOS 43$b$, a NMOS 43$c$ and a NMOS 43$d$), four resistor units constituted of resistance elements (Hereafter, the resistance elements are called a resistor 44$a$, a resistor 44$b$, a resistor 44$c$ and a resistor 44$d$) and a switching element 45.

Namely, a source terminal and a drain terminal of the NMOS 43$a$ are connected to both ends of the resistor 44$a$ in parallel. A source terminal of the NMOS 43$a$ as one end of the test circuit 42 is connected to the voltage VSS and a gate terminal of the NMOS 43$a$ is connected to the signal TMN0.

A source terminal and a drain terminal of the NMOS 43$b$ is connected to both ends of the resistor 44$b$ in parallel. A source terminal of the NMOS 43$b$ is connected to a drain terminal of the NMOS 43$a$. A gate terminal of the NMOS 43$b$ is connected to the signal TMN1.

A source terminal and a drain terminal of the NMOS 43$c$ are connected to both ends of the resistor 44$c$ in parallel. A source terminal of the NMOS 43$c$ is connected to a drain terminal of the NMOS 43$b$. A gate terminal of the NMOS 43$c$ is connected to the signal TMN2.

A source terminal and a drain terminal of the NMOS 43$d$ are connected to both ends of the resistor 44$d$ in parallel. A source terminal of the NMOS 43$d$ is connected to a drain terminal of the NMOS 43$c$. A gate terminal of the PMOS 43$d$ is connected to the signal TMN3.

A switching element 45 is an n-type MOS transistor (Hereafter, the n-type MOS transistor is called a NMOS 45). A source terminal of the NMOS 45 is connected to a drain terminal of the NMOS 43d. A gate terminal of the NMOS 45 is input the signal TMNEN. A drain terminal of the NMOS 45 as the other end of the test circuit 42 is connected to the wiring VINT.

As shown in FIG. 4, each of resistance values of the resistors 44a, 44b, 44c and 44d is set up to be a different value with an ordinal-number power of two, respectively. Namely, the resistor 44a, the resistor 44b, the resistor 44c and the resistor 44d are set up at R, 2R, 4R and 8R, respectively.

The NMOS 43a, the NMOS 43b, the NMOS 43c and the NMOS 43d are put on when each of the gate inputs is "H" and are put off when each of the gate inputs is "L", respectively.

Accordingly, a synthetic resistance value of the test circuit 42 can be selected from fifteen kinds of resistances from R to 15R corresponding to all different combinations in the signal TMN0, the signal TMN1, the signal TMN2 and signal TMN3, respectively. On the other hand, the case of the signal TMN0, the signal TMN1, the signal TMN2 and the signal TMN3 being all "H" is not used as the synthetic resistance value being zero.

In a case of a test-mode, the signal TMNEN is "H". In a case of an operation-mode except the test-mode, the signal TMNEN is "L".

As a test method on the VINT generation circuit 41 in the semiconductor device having the constitution mentioned above is the same as that of the first embodiment, explanation in detail is omitted. The difference between the second embodiment and the first embodiment is mentioned as follows. In the first embodiment, the test current is flowed from the test circuit 12 into the wiring VINT. On the other hand, the test current is flowed from the wiring VINT into the test circuit 12 in the second embodiment, as a result, a voltage level of the wiring VINT is lowered.

Measuring the lowering level of the voltage leads to confirm an operation margin of the VINT generation circuit 41 corresponding to a change of a load current accompanying with an operation of the internal circuit. Therefore, the minimum resistance value R of the test circuit 42 is set up to flow a current which is larger than the maximum load current flowed instantaneously from the wiring VINT in the conventional operation.

According to the second embodiment, as a load current flowing from the VINT generation circuit 41 into the test circuit 42 is generated in simulation, the operation margin of the VINT generation circuit 41 can be easily confirmed including process deviation in a fabricating process.

Furthermore, according to the second embodiment, fifteen kinds of resistance values combined with the signal TMN0, the signal TMN1, the signal TMN2 and the signal TMN3 can be selected. Therefore, the operation margin of the VINT generation circuit 41 can be effectively tested after the fabricating process. As a result, a circuit operation reliability of the VINT generation circuit 41 can be improved.

In the first embodiment and the second embodiment mentioned above, the VINT generation circuits 11 and 41 are constituted of a p-type MOS with feedback control. However, it should be noted that the present invention is not restricted to the embodiments. A voltage generation circuit generating a predetermined voltage corresponding to a load current in a certain current range can also be principally applied. For example, the present invention can also be applied to a voltage-rising circuit generating an internal voltage with a higher voltage than the source voltage by using a charge-pumping circuit.

In the first embodiment and the second embodiment mentioned above, the test circuits 12 and 14 inserted into the voltages VDD and VSS, respectively, is singularly set up, however, it should be noted that the present invention is not restricted to the embodiments. For example, as shown in FIG. 5, both of the test circuits 12 and 42 are connected to an output of a VINT generation circuit 51. The total circuit with both of the test circuits can be necessarily used by suitably controlling /TMPEN and TMNEN.

Third Embodiment

A third embodiment of the present invention mentioned below is difference from the first embodiment and the second embodiment. In the third embodiment, an operation margin of an internal voltage generation circuit (Hereafter, the internal voltage generation circuit is called a VINT generation circuit) is tested by flowing a current into an internal node of the VINT generation circuit.

FIG. 6 is a circuit diagram showing the VINT generation circuit of a semiconductor device in the third embodiment of the present invention. Here, a portion mainly relating a test of the operation margin in the VINT generation circuit is illustrated.

The VINT generation circuit of the semiconductor device according to the third embodiment of the present invention includes a differential amplifier 61, a voltage-dividing circuit 62, a third transistor 63 and two test circuits 64, 65. The differential amplifier 61 compares between a reference voltage (Hereafter, the reference voltage is called a VBGR) and a feedback voltage (Hereafter, the feedback voltage is called a voltage VFB) from an output of the differential amplifier 61. The voltage-dividing circuit 62 generates the voltage VFB by dividing the output of the differential amplifier 61.

A first input of the differential amplifier 61 is connected to the voltage VBGR and a second input of the differential amplifier 61 is connected to the voltage VFB from the voltage-dividing circuit 62. An output of the differential amplifier 61 is connected to a first input of the voltage-dividing circuit 62.

A first output of the voltage-dividing circuit 62 is connected to a gate terminal of the third transistor 63 and a second output of the voltage-dividing circuit 62 is connected to a second input of the differential amplifier 61 as the voltage VFB.

A drain terminal of the third transistor 63 is connected to a first source voltage (Hereafter, the source voltage is called a voltage VDD). A source terminal of the third transistor 63 is connected to the wiring VINT as an output of the VINT generation circuit.

One end of the test circuit 64 is connected to the voltage VDD and the other end of the test circuit 64 is connected to a second input of the voltage-dividing circuit 62.

First control signals of 4 bits (Hereafter, the first control signals are called a signal TMP0, a signal TMP1, a signal TMP2 and a signal TMP3) are input into the first control inputs of the test circuit 64 for controlling a resistance value of the test circuit 64. A second control signal (Hereafter, the second control signal is called a signal /TMPEN) is input into a second control input being showed as a first test mode. A sign "/" shows that the signal is complementary.

One end of the test circuit 65 is connected to the earth voltage (Hereafter, the earth voltage is called a voltage VSS) and the other end of the test circuit 65 is connected to a second input of the voltage-dividing circuit 62.

Third control signals of 4 bits (Hereafter, the first control signals are called signal TMN0, a signal TMN1, a signal TMN2 and a TMN3) are input into the first control inputs of the test circuit 65 for controlling a resistance value of the test circuit 65. A fourth control signal (Hereafter, the second control signal is called a signal TMNEN) is input into a second control input being showed as a second test mode.

The differential amplifier 61 includes, as shown in FIG. 6, two p-type MOS transistors (Hereafter, the p-type MOS transistors are called a PMOS P61 and a PMOS P62), and three n-type MOS transistors (Hereafter, the n-type MOS transistors are called a NMOS N61, a NMOS N62 and a MOS N63).

A source terminal of the PMOS P61 is connected to a second source voltage (Hereafter, the source voltage is called a voltage VPP where the voltage VPP is larger than the voltage VDD). A gate terminal and a drain terminal of the PMOS P61 are connected to a gate terminal of the PMOS P62. A source terminal of the PMOS P62 is connected to the voltage VPP and a drain terminal of the PMOS P62 is connected to a first input of the voltage-dividing circuit 62 as an output of the differential amplifier 61.

A drain terminal of the NMOS N61 is connected to a drain terminal of the PMOS P61 and a gate terminal of the NMOS N61 is connected to the voltage VFB. A drain terminal of the NMOS N62 is connected to a drain terminal of the PMOS P62 and a gate terminal of the PMOS P62 is connected to the voltage VBGR.

A source terminal of the NMOS N61 and a source terminal of the NMOS N62 is connected to a drain terminal of the NMOS N63, a source terminal of the NMOS N63 is connected to the voltage VSS and a gate terminal of the NMOS N63 is input into a bias voltage CMNG.

As the bias circuit generating the bias voltage CMNG are the same as the bias circuit as shown in FIG. 3 of the first embodiment, explanation in detail on the bias circuit is omitted.

The voltage-dividing circuit 62, as shown in FIG. 6, includes one p-type MOS transistor (Hereafter, the p-type MOS transistor is called a transistor P63), one n-type MOS transistor (Hereafter, the n-type MOS transistor is called a transistor N63), and two resistance elements of a resistor R61 and a resistor R62 being connected each other in series, for generating the feedback voltage VFB by dividing the output of the differential amplifier 61.

Namely, a source terminal of the PMOS P63 is connected to the voltage VPP, a gate terminal of the PMOS P63 is connected to the output of the differential amplifier 61 and a drain terminal of the PMOS P63 is connected to the test circuits 64 and 65. A drain terminal of the NMOS N63 is connected to a drain terminal of the PMOS P63, a gate terminal and a source terminal of the NMOS N63 are connected to a gate terminal of the step-down transistor 63 as a first output of the voltage-dividing circuit 62.

One end of the resistor R61 generating the voltage VFB by dividing resistance is connected to a source terminal of the NMOS N64 and the other end of the resistor R61 is connected to a second output of the voltage-dividing circuit 62 for outputting the voltage VFB. One end of the resistor R62 is connected to the other end of the resistor R61 and the other end of the resistor R62 is connected to the voltage VSS.

The step-down transistor 63 is an n-type MOS transistor, a drain terminal of the step-down transistor 63 is connected to the voltage VDD and a source terminal of the step-down transistor 63 is connected to the wiring VINT as an output of the VINT generation circuit.

As a constitution, a function and an operation of the bias circuit generating the test circuit 64 are the same as those of the test circuit 12 as shown in FIG. 1 of the first embodiment, explanation in detail on the test circuit 64 is omitted.

A difference between the first embodiment and the third embodiment is as follows. In stead that the test circuit 64 flows a current into the wiring VINT in the first embodiment, a current is flowed into the divided resistors R61 and R62 of the voltage-dividing circuit 62 so as to raising a voltage level of the voltage VFB.

Further, as a constitution, a function and an operation of the bias circuit generating the test circuit 65 are the same as those of the test circuit 42 as shown in FIG. 4 of the second embodiment, explanation in detail on the test circuit 65 is omitted.

A difference between the second embodiment and the third embodiment is as follows. In stead that the test circuit 65 is flowed a current from the wiring VINT in the second embodiment, a current flowed into the divided resistors R61 and R62 of the voltage-dividing circuit 62 decreases so as to lower a voltage level of the voltage VFB.

As an operation of the VINT generation circuit having the constitution mentioned above in the semiconductor device, the operation of the test circuits 64 and 65 are the same as those of the first embodiment and the second embodiment, explanation in detail on the VINT generation circuit 64 is omitted.

According to the third embodiment, as the test circuits 64 and 65 generated change of the feedback voltage VFB in simulation, the operation margin of the VINT generation circuit 41 can be easily confirmed including process deviation in a fabricating process.

Further, According to the third embodiment, fifteen kinds of resistance values combined with the signal TMP0, the signal TMP1, the signal TMP2 and the signal TMP3 at the voltage VDD and with the signal TMN0, the signal TMN1, the signal TMN2 and the signal TMN3 at the voltage VSS, respectively, can be selected. Therefore, the operation margin of the VINT generation circuit 41 can be effectively tested after the fabricating process. As a result, a circuit operation reliability of the VINT generation circuit 41 can be improved.

In the third embodiment mentioned above, the test circuits 64 and 65 are connected to the drain terminal of the transistor N64, however, it should be noted that the present invention is not restricted to the embodiments. For example, the test circuits 64 and 65 can be connected to the source terminal of the NMOS N64 or a connection node at a halfway of the resistors R61 and R62. Furthermore, the test circuits 64 and 65 can be constituted to have a capability of exchanging the plurality of connection points.

Fourth Embodiment

A fourth embodiment of the present invention mentioned below has a same portion as the third embodiment. In the fourth embodiment, an operation margin of an internal voltage generation circuit (Hereafter, the internal voltage generation circuit is called a VINT generation circuit) is tested by flowing a current into an internal node of the VINT generation circuit.

FIG. 7 is a circuit diagram showing the bias circuit the VINT generation circuit of a semiconductor device according to the fourth embodiment of the present invention. Here, a portion mainly relating to a test of an operation margin in the VINT generation circuit is illustrated.

The bias circuit in the VINT generation circuit in the semiconductor device according to the fourth embodiment of the present invention includes three p-type MOS transistors (Hereafter, the MOS transistors are called a PMOS P71, a PMOS P72 and a PMOS P73), three n-type MOS transistors (Hereafter, the MOS transistors are called a NMOS P71, a NMOS P72 and a NMOS P73), a resistance element R71, a diode D71 and a test circuit 75.

A source terminal of the PMOS P71, a source terminal of the PMOS P72 and a source terminal of the PMOS P73 are connected to a source voltage (hereafter, the source voltage is called a voltage VDD.) A gate terminal of the PMOS P71 is connected to a gate terminal and a drain terminal of the PMOS P72. A gate terminal of the PMOS P73 is connected to a drain terminal of the PMOS P72. A drain terminal of the PMOS P73 is supplied to a differential amplifier (not illustrated) as an output voltage CMNG. For example, the differential amplifier means such as the differential amplifier 21 as shown in FIG. 2 or the differential amplifier 61 as shown in FIG. 6.

A drain terminal and a gate terminal of the NMOS N71 are connected to a drain terminal of the PMOS P71. A drain terminal of the NMOS N72 is connected to a drain terminal of the PMOS P72. A gate terminal of the NMOS N72 is connected to a gate terminal of the NMOS N71. A drain terminal and a gate terminal of the NMOS N73 are connected to a drain terminal of the PMOS P73. A source terminal of the NMOS N73 is connected to an earth voltage (hereafter, the earth voltage is called a voltage VSS).

The resistance element R71 is connected between a source terminal of the NMOS N71 and the voltage VSS and the diode D71 is connected between a source terminal of the NMOS N72 and the voltage VSS by forward bias.

One end of the test circuit 75 is connected to the other end of the resistance element R71 and the other end of the test circuit 75 is connected to the voltage VSS. First control signals of 4 bits (Hereafter, the first control signals are called a signal TMN0, a signal TMN1, a signal TMN2 and a signal TMN3) are input into the first control inputs of the test circuit 75 for controlling a resistance value of the test circuit 75. A second control signal (Hereafter, the second control signal is called a signal TMNEN) is input into a second control input being showed as a test mode.

As a constitution, a function and an operation of the bias circuit generating the test circuit 75 are the same as those of the test circuit 42 as shown in FIG. 4 of the second embodiment, explanation in detail on the test circuit 75 is omitted.

A difference between the second embodiment and the fourth embodiment is as follows. In stead that the test circuit 75 is flowed a current from the wiring VINT in the second embodiment, a current being flowed into the resistance element R71 of the bias circuit is controlled to change a bias current flowed in the differential amplifier generated by the voltage CMNG.

As an operation of the test circuit of the VINT generation circuit in the semiconductor device having the constitution mentioned above is the same as the operation of the test circuit as shown in the second embodiment, explanation in detail on the operation of the test circuit is omitted.

According to the fourth embodiment, as the test circuit 75 generates the bias current change in the differential amplifier of the VINT generation circuit in simulation, the operation margin of the VINT generation circuit can be easily confirmed including process deviation in a fabricating process.

Furthermore, according to the fourth embodiment, fifteen kinds of resistance values combined with the signal TMN0, the signal TMN1, the signal TMN2 and the signal TMN3 can be selected. Therefore, the operation margin of the VINT generation circuit can be effectively tested after the fabricating process. As a result, a circuit operation reliability of the VINT generation circuit can be improved.

In the description from the first embodiment to the fourth embodiment mentioned above, the test circuit has four resistance units and the first control input has four bits, however, it should be noted that the present invention is not restricted to the embodiments. For example, the test circuit principally is adaptable when the test circuit has one more resistance unit.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the claims that follow. The invention can be carried out by being variously modified within a range not deviated from the gist of the invention.

What is claimed is:

1. A semiconductor device, comprising:
an internal voltage generation circuit generating a prescribed voltage,
a first test circuit connecting to a voltage-supplying wiring, one end of the first test circuit being connected to a source wiring and the other end of the first test circuit being connected to the internal voltage generation circuit, the first test circuit being supplied an outer voltage from the source wiring and a voltage of the internal voltage generation circuit through the voltage-supplying wiring, the first test circuit generating a prescribed resistance value on a basis of a control input from an outer portion in a test mode;
wherein the first test circuit has a plurality of MOS transistors, a plurality of resistors and a first switching MOS transistor setting up the test mode, each of the MOS transistors and each of the resistors are constituted of a pair and connects each other in parallel, each of the pairs is connected each other in series, one end of the pairs being connected in series is connected to the source wiring and the other end of the pairs being connected in series is connected to a source terminal of the first switching MOS transistor, and a drain terminal of the first switching MOS transistor is connected to the voltage-supplying wiring.

2. The semiconductor device according to claim 1, further comprising:
a second test circuit, one end of the second test circuit connecting to the source wiring and the other end of the second test circuit connecting to the second test circuit, the second test circuit being supplied the outer voltage from the source wiring and supplied the voltage of the internal voltage generation circuit through the second test circuit, the second test circuit generating the prescribed resistance value on the basis of the control input from the outer portion in the test mode.

3. The semiconductor device according to claim 2, wherein the source wiring connecting to the first test circuit supplies one of a source voltage or an earth voltage from the outer portion, the source wiring connecting to the second test circuit supplies the other of the source voltage or the earth voltage.

4. The semiconductor device according to claim 2, wherein the second test circuit has a plurality of MOS transistors, a plurality of resistors and a second switching MOS transistor setting up the test mode, each of the MOS transistors and each of the resistors is constituted of a pair and connects each other in parallel, each of the pairs is connected each other in series, one end of the pairs being connected in series is connected to the source wiring and the other end of the pairs being connected in series is connected to a source terminal of the second switching MOS transistor, and a drain terminal of the second switching MOS transistor is connected to the second test circuit.

5. A semiconductor device, comprising:
an internal voltage generation circuit generating a prescribed voltage, a first test circuit connecting to a voltage-supplying wiring, one end of the first test circuit being connected to a source wiring and the other end of the first test circuit being connected to the internal voltage generation circuit, the first test circuit being supplied an outer voltage from the source wiring and a voltage of the internal voltage generation circuit through the voltage-supplying wiring, the first test circuit generating a prescribed resistance value on a basis of a control input from an outer portion in a test mode;

the internal voltage generation circuit includes a differential amplifier, a voltage-dividing circuit and a gate MOS transistor, a first input of the differential amplifier is connected to a reference voltage, the voltage-dividing circuit divides an output voltage of the differential amplifier by dividing a resistance, the voltage-dividing circuit feedbacks the prescribed voltage to a second input of the differential amplifier, the voltage-dividing circuit is constituted of a first resistance element and a second resistance element, the voltage-dividing circuit is connected to the second input of the differential amplifier at a point between the first resistance element and the second resistance element, the gate MOS transistor controls the source voltage supplied from the source wiring on a basis of an output voltage of the differential amplifier, the gate MOS transistor generates an internal voltage and the gate MOS transistor supplies a current on the basis of the control input to the voltage-dividing circuit in the test mode.

6. The semiconductor device according to claim 5, further comprising:

a bias circuit being connected to a third input of the differential amplifier, the bias circuit controlling a current of the differential amplifier.

* * * * *